(12) United States Patent
Morita (10) Patent No.: US 6,344,956 B1
(45) Date of Patent: Feb. 5, 2002

(54) OXIDE BULK SUPERCONDUCTING CURRENT LIMITING ELEMENT CURRENT

(75) Inventor: Mitsuru Morita, Futtsu (JP)

(73) Assignee: Nippon Steel Corporation, Tokyo (JP)

( * ) Notice: Subject to any disclaimer, the term of this patent is extended or adjusted under 35 U.S.C. 154(b) by 0 days.

(21) Appl. No.: 09/392,579

(22) Filed: Sep. 9, 1999

(30) Foreign Application Priority Data

May 8, 1998 (JP) .......................................... 10-140435
Apr. 19, 1999 (JP) .......................................... 11-110897

(51) Int. Cl.[7] .............................................. H02H 9/00
(52) U.S. Cl. ......................... 361/19; 361/58; 361/93.9
(58) Field of Search ........................... 361/19, 58, 141, 361/93.9; 505/850, 851, 881; 338/20, 325

(56) References Cited

U.S. PATENT DOCUMENTS

| | | | |
|---|---|---|---|
| 5,235,309 A | 8/1993 | Preisler et al. | 338/20 |
| 5,355,275 A | 10/1994 | Goodier et al. | 361/141 |
| 5,432,666 A | 7/1995 | Hodge | 351/19 |
| 5,642,249 A | 6/1997 | Kuznetsov | 361/58 |

OTHER PUBLICATIONS

Computer Modelling of Superconductive Fault Current Limiters:, R.A. Weller, et al. 1998 (No Month).

"Transport Currents Along C–Axis and (a,b) Planes in YBCO Single Domain Materials. Cirtical Current Densities and Normal–Superconducting Transitions", L. Porcar, et al. 1998 (No Month).

*Primary Examiner*—Michael J. Sherry
(74) *Attorney, Agent, or Firm*—Kenyon & Kenyon

(57) ABSTRACT

A current-limiting device employing a bulk superconductive material wherein a non-superconductive phase is finely dispersed in a $REBa_2$—$Cu_3$—$O_{7-x}$ phase as a superconductive phase, where the current-limiting device has a mechanism that promotes or generates quenching beyond the conduction current.

24 Claims, 9 Drawing Sheets

OXIDE BULK SUPERCONDUCTING CURRENT LIMITING ELEMENT CURRENT

BACKGROUND OF THE INVENTION

1. Field of the Invention

The present invention relates to a superconductive/normal conductive transition-type current-limiting element and current-limiting device that employs an oxide superconductive body.

2. Description of the Related Art

Fault current (short-circuit current) accidents in power circuits produce very large fault current flows. Fault currents are cut off by circuit-breakers, but even a breaker allows flow of fault current for a few tens of milliseconds, which generates a large electromagnetic force and massive Joule heat, causing the power devices and electric circuits to undergo considerable mechanical and thermal damage. A demand exists for development of a trouble-handling current-limiting device that can inhibit fault current in the event of such accidents, and thus support the function of circuit-breakers. Such a current-limiting device would have a major effect through stabilization of various power distribution systems, and with the ever-increasing complexity of modern-day systems, the rapid realization of such a current-limiting device is highly anticipated.

Numerous types of current-limiting devices have been proposed, but none of them are highly practical as of this writing. Those in relatively wide use include current-limiting reactors, permanent fuses, current-limiting cables and electric arc current-limiting devices, but these also have such problems as high electrical resistance and thus high heat generation when carrying load current, or a slow response resulting in poor current-limiting performance.

Some of the qualities required for current-limiting devices include low electrical resistance and minimal heat generation when carrying normal load current, as well as a fast response with high electrical resistance in the event of short-circuit accidents. From this standpoint it is thought that current-limiting devices employing superconductors are ideal. Superconductive current-limiting devices that have been proposed include superconductive/normal conductive transition types, reactor types, rectifier types and coil types. Among these, superconductive/normal conductive transition-type current-limiting devices most directly utilize the superconduction/normal conduction transition properties of superconductors. When carrying a load current, the current flowing to the superconductor is never greater than the critical current, and therefore the resistance of the superconductor is extremely low. In the event of a short-circuit accident, however, the current flowing to the superconductor exceeds the critical current, and the heat generated thereby causes transition of the superconductor from a superconductive state to a normal conductive state, thus generating electrical resistance. This resistance limits the fault current. The superconductive/normal conductive transition-type current-limiting device is characterized by having a simpler construction and smaller size than other types of superconductive current-limiting devices.

The superconductive/normal conductive transition-type current-limiting element in which a load current flows directly in a superconductor as above is also called a "resistance-type current-limiting element" and is disclosed, for example, in U.S. Pat. No. 5,235,309 to Preisler et al. There is also a so-called "magnetic shield-type current-limiting element" in which a load current does not flow directly in a superconductor and, in the event of a short circuit, the magnetic shield effect of a superconductor lowers thereby rapidly increasing the inductance of a magnetic circuit, which is disclosed, for example, in U.S. Pat. No. 5,355,275 to Goodier et al.

The superconductive current-limiting device described above may employ a metal-based superconductor or an oxide-based superconductor. Metal-based superconductors have been associated with problems such as low electrical resistance in a normal conductive state and requirements for larger-sized apparatuses and use near liquid helium temperatures that result in higher operating costs, while the apparatuses are also larger from the standpoint of thermal insulation. Demand is therefore high for the development of current-limiting devices employing oxide based superconductors with high electrical resistance in the normal conductive state, where the superconductive state can be maintained with cheaper liquid nitrogen.

Superconductive current-limiting devices employing oxide superconductive materials in the published literature include a type wherein a thin-film current-limiting element is formed on a substrate (Japanese Unexamined Patent Publication No. 2-281766) and a type using a bulk sintered body (Minutes of the Power & Energy Group Meeting at the 1995 Electrical Convention, p. 697). The type of device employing a thin-film has a high critical current density but a low cross-sectional area, and therefore does not attain a current value at the level used in actual low-voltage systems. On the other hand, sintered bodies have a large cross-sectional area but a low critical current density, and therefore attain a similar level. Thus, the development of a current-limiting device employing an oxide superconductive material with a current capacity that can withstand use in actual systems is an important issue.

Specifically, because oxide superconductive materials are used at relatively high temperatures, they have been associated with the problem of susceptibility to blowout with local temperature increase, as a consequence of their higher specific heat in the temperature range of their use compared to metal-based superconductive wiring used at near 4.2 K, as well as their low thermal conductivity which hampers propagation at areas that have undergone transition to normal conduction. This susceptibility to blowout can also be attributed to the fact that oxide superconductors are poorly suitable for achieving fine gauges and uniformity, compared to metal-based wiring materials.

The present invention overcomes the problems described above by providing a current-limiting device employing a bulk superconductor with a large current capacity, which device has a fast response and generates uniform quenching without blowout.

SUMMARY OF THE INVENTION

It is the gist of the present invention that in a current-limiting device including a superconductive/normal conductive transition-type current-limiting element employing an oxide superconductor wherein $RE_2BaCuO_5$ (where RE is at least one element selected from among Y, Pr, Nd, Sm, Eu, Gd, Dy, Ho, Er, Tm, Yb and Lu) is finely dispersed in an $REBa_2Cu_3O_{7-x}$ phase, it is extremely effective to provide a mechanism which promotes or generates quenching in addition to the conduction current, in order to minimize local quenching due to non-uniformity of the superconductive properties, to accomplish transition of the current-limiting element from a superconductive state to a normal conductive state, and to achieve a higher response speed. According to the invention, "quenching" refers to a sudden transition from superconduction to normal conduction.

BRIEF DESCRIPTION OF THE INVENTION

DESCRIPTION OF THE PREFERRED EMBODIMENTS

Figure 2:
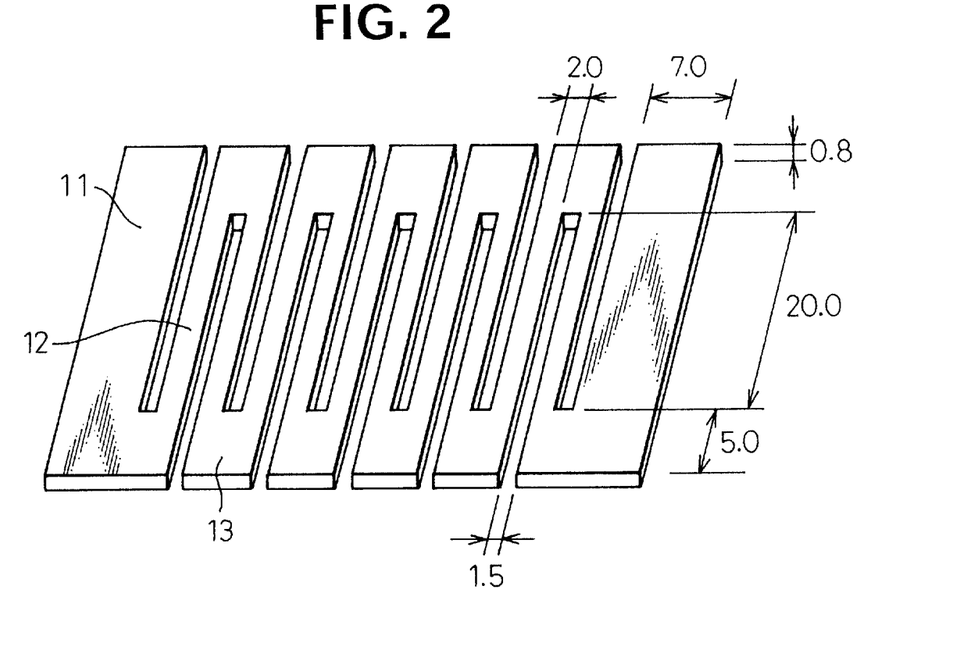
FIGS. 2 and 3 are illustrations of meander-shaped current-limiting elements.

Because the aforementioned single crystal oxide superconductive materials lack workability in comparison to metal superconductive materials, the shape of a superconductive/normal conductive transition-type current-limiting element employing an oxide superconductor is preferably a meander shape, which can be produced by linear working. FIG. 2 shows an example of such a case. Here the meander shape means one such as shown in FIG. 2, with at least two sections where the direction of the current on the plane makes turns preferably at 180°, when a state of conduction is considered. The critical current density within the a-b plane of $REBa_2Cu_3O_{7-x}$ must be about 3 times higher than the critical current density in the c-axis direction, and from the standpoint of mechanical strength, the sheet surface of the meander material must be roughly parallel (within ±30°, and more preferably within ±10°) to the c-axis.

The elemental lines of both terminals 11 of the meander-shaped sheet are the sections connected to copper electrodes, etc., and if their cross-sectional area (wiring width) is less than the cross-sectional area (wiring width) of the inner elemental lines 12, heat from contact resistance with the copper electrode will impair the conduction properties, tending to cause quenching from both ends and burn-out, before the entire elemental lines of the meander-shaped sheet undergoes transition to normal conduction. The cross-sectional area of the elemental lines at both ends 11 must therefore be sufficiently larger than the cross-sectional area of the rest of the elemental lines 12. Specifically, it will depend on the size of the contact resistance, but even when silver is used to reduce the contact resistance it is preferred for the cross-sectional area of the elemental lines at both ends to be at least three times the cross-sectional area of the rest of the elemental lines.

If the cross-sectional area of the sections connecting the elemental lines of the meander-shaped sheet (elemental lines turn sections) 13 is smaller than the cross-sectional area of the elemental lines 12, quenching and burn-out will tend to occur from the elemental line turn sections before the entire elemental line undergoes transition to normal conduction. The cross-sectional area of the elemental line turn sections 13 must therefore be sufficiently larger than the cross-sectional area of the elemental lines 12. Even when a blowout-preventing bypass circuit is mounted on this area it is necessary to reduce the contact resistance, and even when silver is used at the elemental lines turn sections to reduce the contact resistance, it is preferred for the cross-sectional area of the elemental line turn sections to be at least twice the cross-sectional area of the elemental lines.

The aspect ratio (thickness/width) of the cross-sectional area of the elemental line is preferably low from the standpoint of AC loss and easier magnetic field assist, but it is preferably about 1 from the standpoint of the mechanical strength of the material and the number of elemental lines (the length) per meander material sheet. As a result of much research on these conditions, the present inventors have found that an aspect ratio of 0.6-0.2 is optimum.

Figure 3:
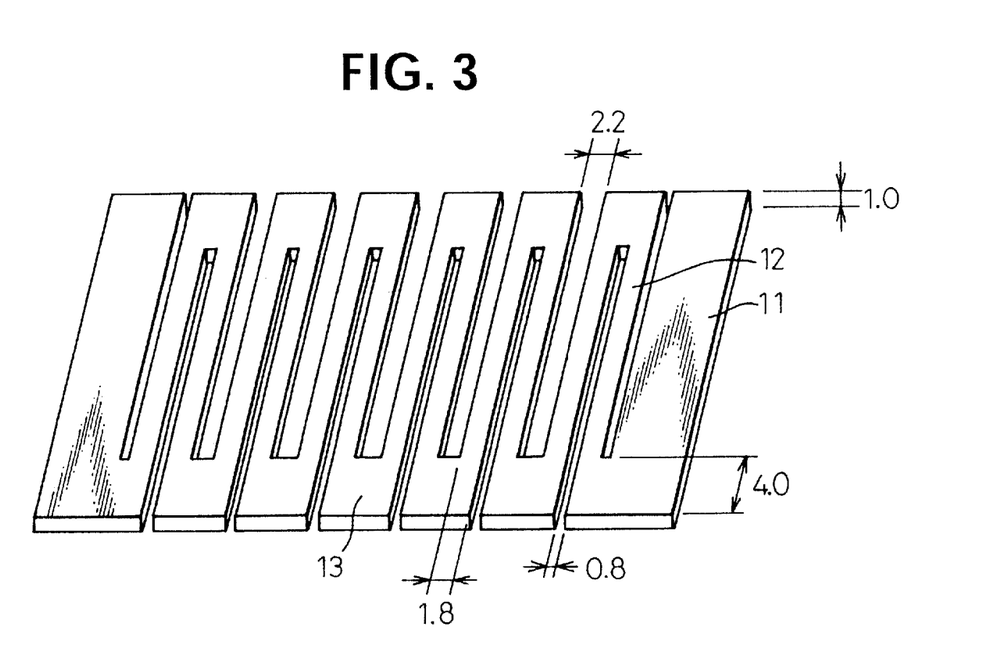

When a magnetic field is applied to a superconductive/normal conductive transition-type current-limiting element with a meander shape, it is sometimes better to have an inconsistent elemental line spacing, as will be explained later. Also, as shown in FIG. 3, a magnetic field can sometimes be more efficiently applied when the spacing of the elemental lines 12 varies.

It is extremely important for protection of the element to mount a bypass circuit on the superconductive/normal conductive transition-type current-limiting element, in order to avoid blowout sections in the superconductive/normal conductive transition-type current-limiting element that undergo local resistance increase. Bypass circuits can be generally of two kinds. One kind is connected to the entire element surface by coating or the like. The other kind has terminals spaced along the surface of the element with a resistor element mounted between the terminals.

Since the former kind of bypass circuit is formed over the entire surface, it is ideal as a protection circuit against non-uniform element properties. However, it is usually difficult for coating to provide a resistor element with a cross-sectional area sufficient for bypassing of large currents. In contrast, since the latter kind allows a bypass resistor to be situated away from the element, it is easier to provide a resistor element with a cross-sectional area sufficient for bypassing of large currents.

Figure 4:
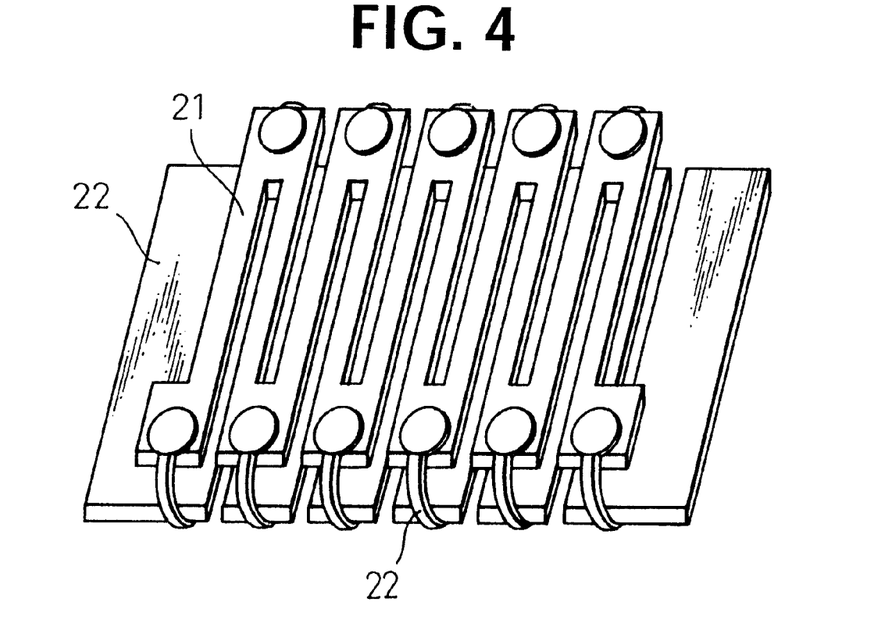
FIG. 4 is an illustration of a superconductive current-limiting element with a bypass circuit mounted thereon.

In the case of a meander-shaped superconductive/normal conductive transition-type current-limiting element, the surface area of both ends of the current-limiting element and of the elemental line turn sections is wider and thus suited for connection of bypass circuit terminals. An example of this is shown in FIG. 4. On a meander-shaped superconductive current-limiting element 20 there is formed a bypass circuit by soldering a bypass resistor (of NiCr, for example) 21 with the same meander shape onto the elemental line turn sections via copper wires 22.

A shorter terminal spacing of the bypass circuit provides a greater function for protection of the current-limiting element. If the wiring is too long it is sometimes insufficient at only the elemental line turn sections. In such cases it becomes necessary to lead the terminals of the bypass circuit out from within the elemental line. For a current-limiting element with a magnetic field application mechanism, it is necessary to connect the bypass circuit to the terminals through gaps or through-holes in the iron core of the magnetic field application magnet.

Figure 5:
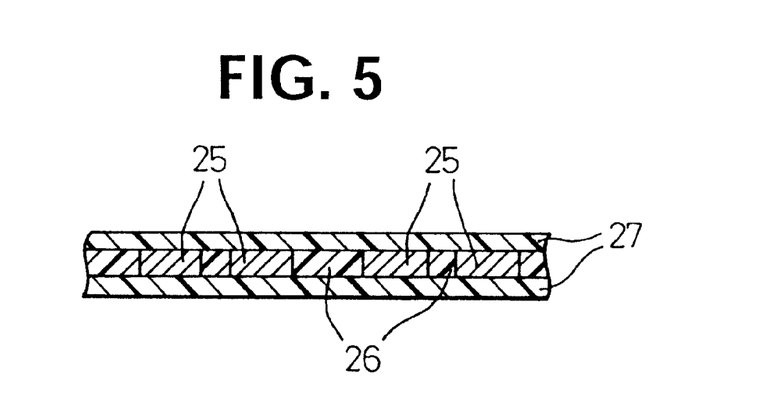
FIG. 5 is an illustration of a current-limiting element with a resin packed between the elemental lines.

When the current-limiting element is a superconductive/normal conductive transition type, drastic increases in temperature are generated. The increased temperature of the wiring creates stress in the elemental lines due to thermal expansion. A large stress can cause mechanical damage and impairment of the characteristics of the elemental lines. To protect the current-limiting element from such damage it is effective to provide reinforcement by insertion of a resin at least between the elemental lines. Since the thermal expansion coefficient of a resin is generally greater than that of an oxide superconductive material, it is preferably mixed with solid matter having a relatively low thermal expansion coefficient such as ceramic powder, prior to insertion and hardening between the elemental lines. More preferably, a sheet-like composite material such as FRP (fiber-reinforced plastic) may be placed on both sides of the meander material, and the elemental lines spacings anchored, together with the FRP, by the resin. An example of this is shown in FIG. 5. A resin 26 is filled between the spaces of a superconductive current-limiting element 25 which is sandwiched between FRP plates 27.

Mechanisms that promote or generate quenching other than the conduction current include mechanisms which detect abnormal current and apply a magnetic field. Since the c-axis direction is the direction in which it is easiest to lower the Jc, the direction of magnetic field application is preferably parallel to the c-axis of the superconductive material.

The magnetic field must be applied immediately after detection of abnormal current. The inductance of the magnetic field application coil is therefore preferably as low as possible. Methods exist for designing the magnetic field distribution so that the magnetic field traces a small loop. In this sort of magnetic field distribution, the current-limiting element is exposed to a magnetic field of a different polarity.

Figure 6A:
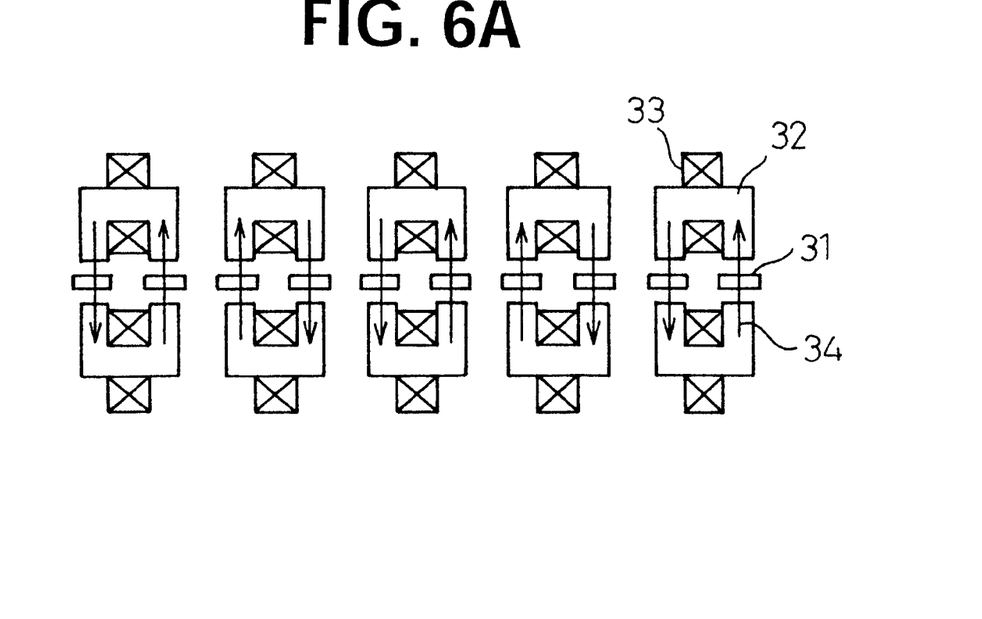
FIGS. 6A and 6B are illustrations of current-limiting elements provided with magnetic field application mechanisms.
Figure 6B:
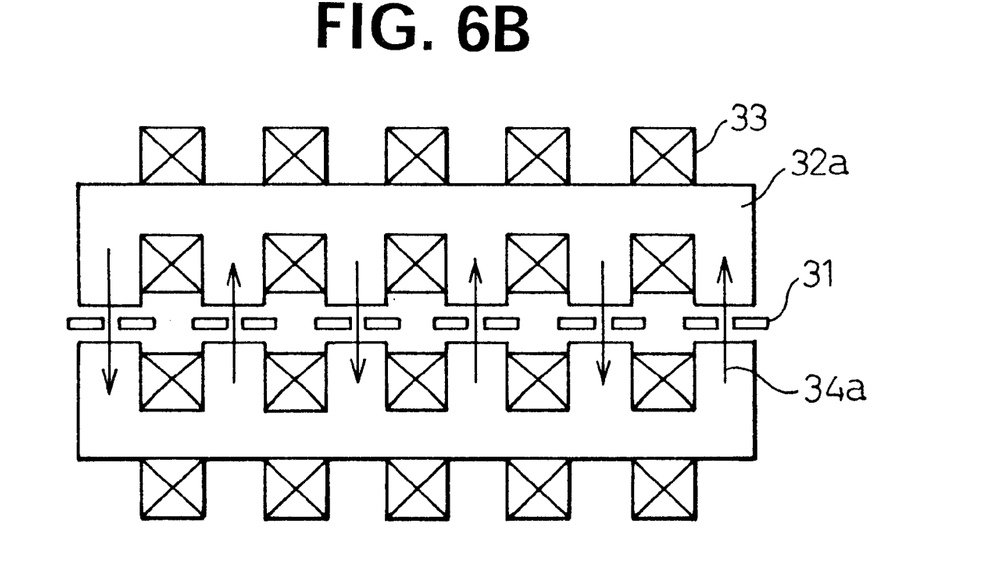

The magnetic field distribution produced by the magnetic field application device shown in FIG. 6A shows a case where magnetic fields 34 of opposite polarities are alternately applied to pairs of elemental lines 31. This type of magnetic field distribution has a low inductance and allows application of a large magnetic field, which is highly effective for promoting quenching. In FIG. 6A, the magnetic field 34 is applied in the direction indicated by the arrow by a magnetic field application device having a coil 33 wound around an iron core 32. FIG. 6B is a modified version of the magnetic field application device, and because of the shape of the iron core 32a as shown, magnetic fields 34a of opposite polarities are applied to each elemental lines path 31.

By connecting multiple magnetic field application coils in parallel, it is possible to connect resistors in series to each coil, so that adjustment of each resistance value allows control of the current level whereby adjustment can be made for more uniform quenching of the element.

The current power source supplied to the magnetic field application coil is preferably a power source substantially consisting of an LC resonance circuit including a condenser and a thyristor switch. The charge stored in the condenser is supplied to the magnetic field application coil upon detection of abnormal current, thus generating a magnetic field. Because of the resonance circuit construction, part of the charge subsequently returns to the condenser. Using this type of power source facilitates repeated application of a large magnetic field within a short time.

Figure 1:
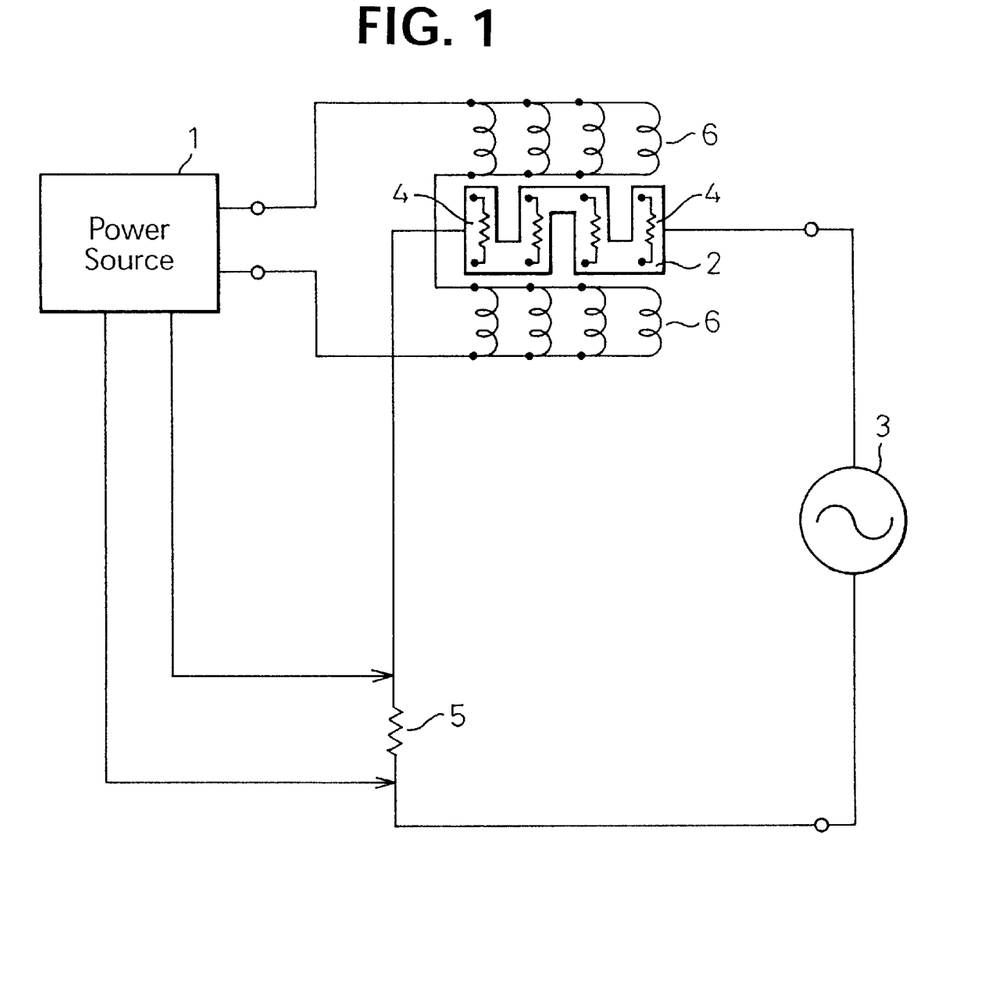
FIG. 1 is a conceptual view of a current-limiting device with a magnetic field application mechanism.

FIG. 1 shows a conceptual view of the above-described current-limiting device with a magnetic field application mechanism. When the current monitor resistor 5 detects an abnormal current, a current is supplied to the magnetic field application coil 6 from the magnetic field application power source 1. A magnetic field is then applied to the current-limiting element 2, quenching is promoted, and the current-limiting operation is rapidly accomplished. FIG. 1 is a circuit diagram showing a layout wherein this type of current-limiting device is connected to a power source 3.

Figure 7:
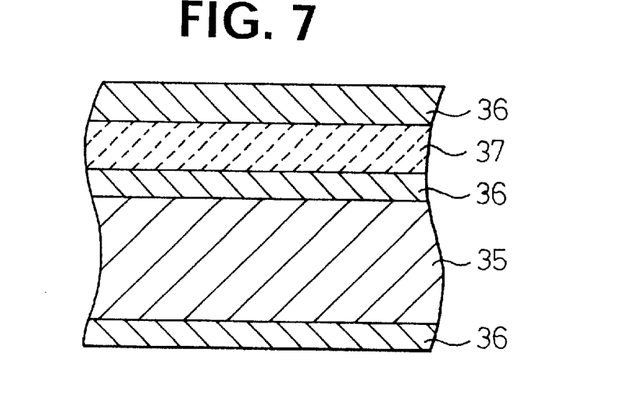
FIG. 7 is an illustration of a current-limiting element provided with heating means.

Methods of promoting quenching include not only magnetic field application but also means whereby the entire element is quenched by detecting abnormal current, and heating the superconducting element to drastically raise the element temperature. By allowing a current to flow to a heating conduction circuit situated parallel to the current-limiting element, it is possible to form a heating conduction circuit along the current path to bring out the superconductive/normal conductive transition-type features and thus allow convenient fabrication of a heating conduction circuit. Specifically, a conductive layer may be formed on the surface of the current-limiting element via an insulating layer. In this case it is preferred for the insulating layer and conductive layer to be made of substances with as high thermal conductivity as possible. Specifically, the insulating layer may be a high thermal conductivity organic substance and the conductive layer may be a metal or alloy of silver, copper, Al, etc. An example of this is shown in FIG. 7. Conductive layers 36 are formed on both surfaces of a superconductive current-limiting element 35, with an insulating layer 37 and another conductive layer 36 formed thereover.

It will be readily appreciated that the magnetic field application and heating mechanism can be used in combination to further enhance the effect.

In a mechanism that promotes or generates quenching beyond the conduction current as described above, it is possible to determine when abnormal current flows (and immediately apply the magnetic field or heat) by detecting at least one of the following three conditions.

(1) The point when the current flowing through the current-limiting element exceeds a given set current value level.

(2) The point when the degree of time variation of a set current value for current flowing through the current-limiting element exceeds a certain value.

(3) The point when a voltage above a given level is generated in the current-limiting element.

In practical use these three conditions may all be considered for the detection, based on the conditions of use, etc.

The function of the present invention will now be further explained.

As mentioned above, when local quenching is generated by non-uniformity of the superconductive properties of the bulk material, and a large amount of heat is generated locally which leads to damage such as blowout, while the failure of the entire current-limiting element to undergo transition to normal conduction prevents generation of sufficient electrical resistance making it impossible to achieve the necessary current-limiting operation.

In order to control such local quenching to convert the entire current-limiting element from a superconductive state to a normal conductive state to achieve a fast response rate, it is effective to promote or generate quenching other than by the conduction current.

The current-limiting element emits heat basically due to resistance generated with the conduction current, and upon exceeding the critical temperature undergoes transition to a normal conductive state. Resistance generation of primarily the following two types is required. For a relatively low level current (normal current conduction), the dominant heat generation is that caused by variation of the conduction current with time, known as AC loss. For a relatively high level current (abnormal current conduction), an automagnetic field generated by the conduction current, i.e. the magnetic flux, moves through the superconductor. This is known as flux flow resistance (Rf). Rf is proportional to the exponential function of the conduction current, and the gradient is said to be about 5–7 for oxide superconductors with an $RE_2BaCuO_5$ phase finely dispersed in an $REBa_2CuO_{7-x}$, phase.

By applying an external magnetic field it is possible to generate a larger Rf in the current-limiting element even at the same conduction current value. This raises the entire current-limiting element above the critical temperature more rapidly, thus avoiding local damage by local quenching and allowing the necessary electrical resistance to be generated. Because of their crystalline structure, $REBa_2Cu_3O_{7-x}$-based conductive materials are most susceptible to reduction in Jc by an external magnetic field in the c-axis direction.

External heating is a direct method of increasing the temperature of the current-limiting element. Heating methods include conduction heating, induction heating and the like. In the case of conduction heating, heating can be accomplished relatively easily by a normal conductor heater along the conduction path in a resistance-type current-limiting element.

In the current-limiting device of the invention, the timing is important with respect to rapid detection of abnormal conduction current, application of the magnetic field and heating. For actual use of a current-limiting device, it is connected to a transformer, transmission line, circuit-breaker, switch, etc. and is incorporated as a 3-phase circuit. The short-circuit resistance of the circuit thus changes depending on the location of the accident and the nature of the accident. This also changes based on the type of system used.

Basically, in order to meet the specification standards for a circuit-breaker it is necessary for it to operate at the point where the current value flowing through the current-limiting element exceeds a given value. The detection of abnormal current can also be based on the degree of time variation of the current flowing through the current-limiting element, while considering the size of the impedance of the transformer. The element can also be quenched even when the two conditions mentioned above are not met, in which case damage to the element can be prevented by referring to the voltage generation in the current-limiting element.

EXAMPLES

Example 1

Figure 8A:
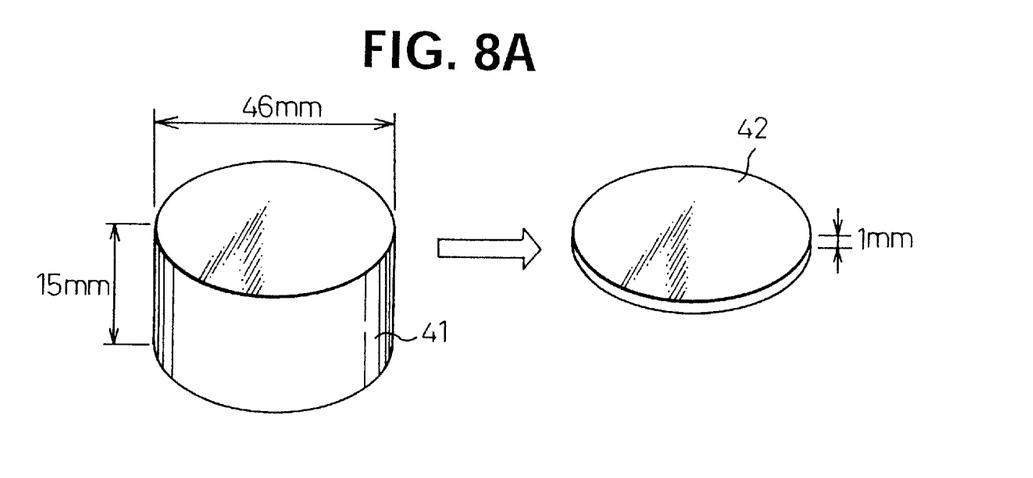
FIGS. 8A and 8B show a process for fabrication of a meander-shaped current-limiting element from a cylindrical bulk material.
Figure 8B:
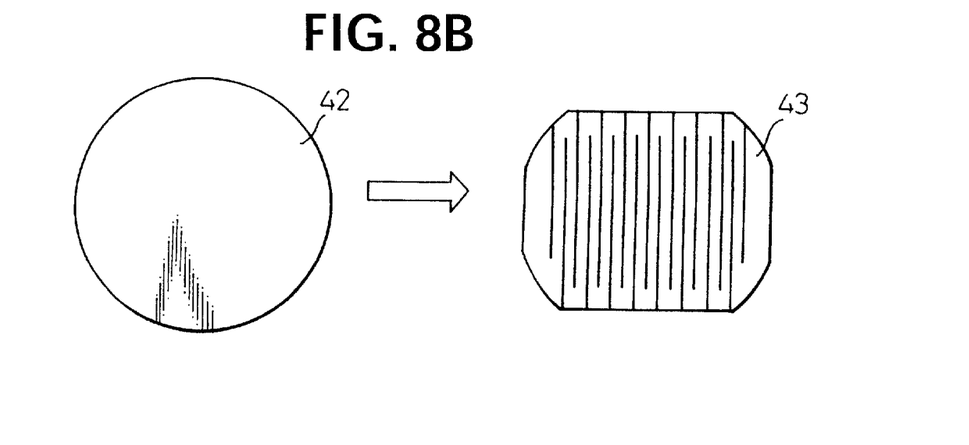

A single crystal superconductive bulk material 41 with a diameter of 46 mm and a height of 15 mm having $Y_2BaCuO_5$ finely dispersed in $YBa_2Cu_3O_{7-x}$ was cut into a slice 42 with a thickness of 1 mm as shown in FIG. 8A, and was subjected to notch working to fabricate a current-limiting element 43 with a meander shape having an effective length of about 600 mm and a current path cross-sectional area of 1 mm², as shown in FIG. 8B. Next, an Ag thin-film was vapor deposited over the entire surface to a thickness of about 1 micron and held for 10 minutes in an oxygen stream while first heating it to 900° C., after which it was cooled by lowering the temperature to 600° C. over 2 hours and then to room temperature over 20 hours. Copper lead wires were connected to the electrodes at both ends with solder, and then cooled in liquid nitrogen.

Figure 9:
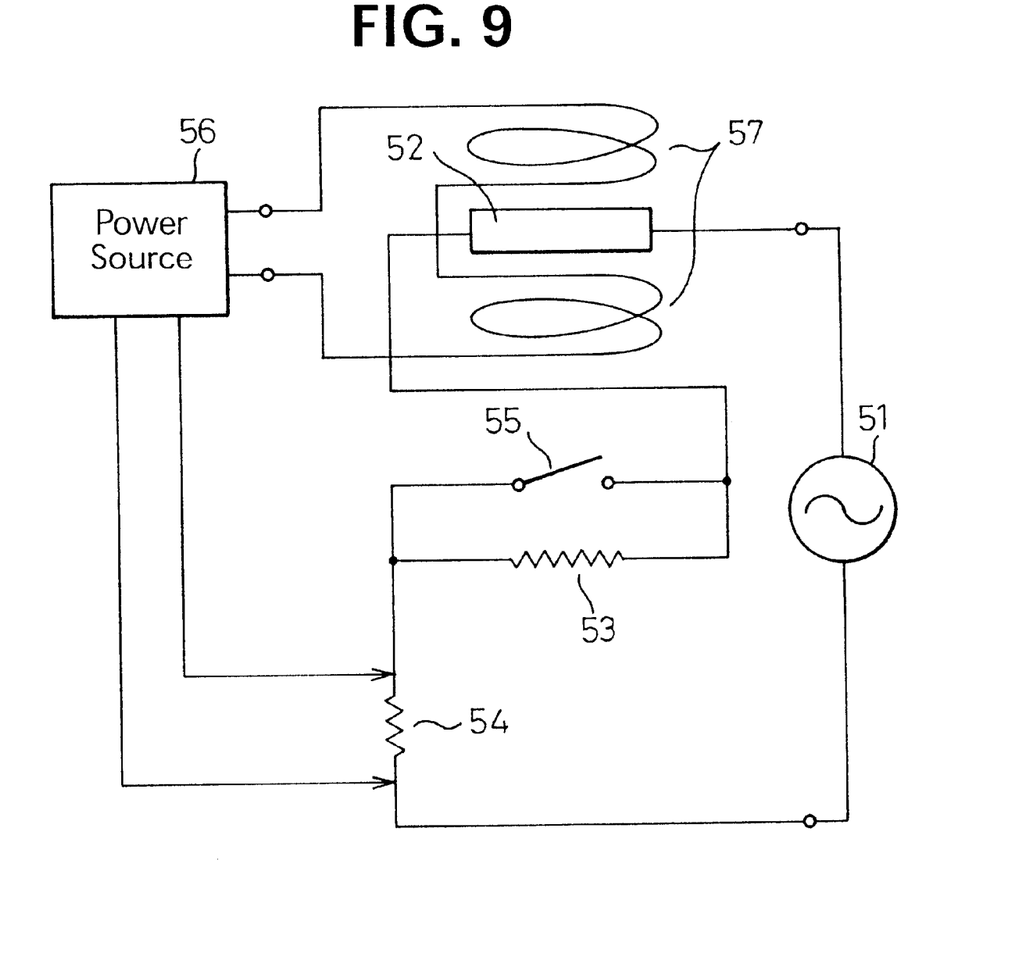
FIG. 9 is a circuit diagram used for a conduction experiment.

A pulse magnetic field application device was fabricated, and the circuit shown in FIG. 9 was constructed to allow application of a maximum 0.4 T magnetic field to the current-limiting element parallel to the c-axis of the superconductive material. Abnormal current was simulated by passing a current from a power source 51 to the current-limiting element 52 with a resistor 53 as the load, and then using a switch 55 to short-circuit the resistor 53. The abnormal current was detected with a current monitor resistor 54, and upon detection of the abnormal current, a current was supplied to a magnetic field application coil 57 by a magnetic field application power source 56. A magnetic field was thus applied to the current-limiting element 52. The power source 51 was set to allow the current to be shut off once the current reached the zero point after detection of the abnormal current. It was also adjusted so that a 0.4 T magnetic field was applied to the current-limiting element at the moment of 900 A conduction.

Figure 10:
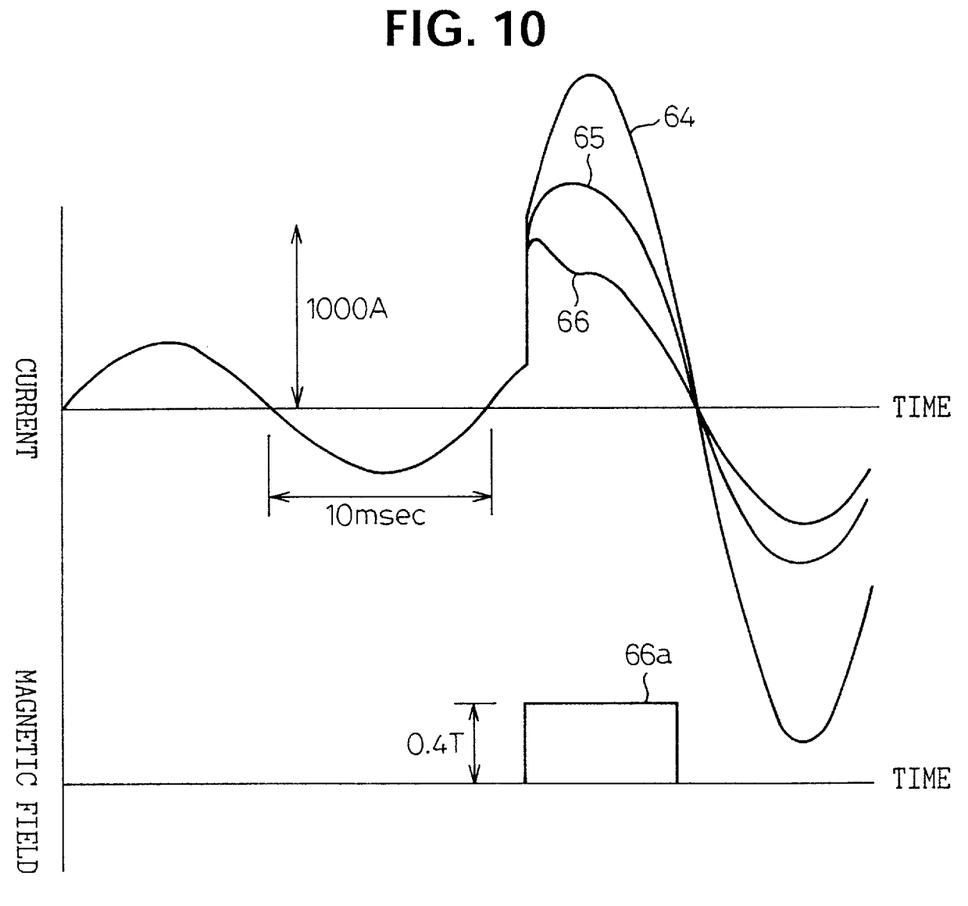
FIGS. 10–12 are graphs showing current-limiting properties of current-limiting elements according to the examples.

First, an alternating current of 500 A (p–p: peak to peak) was applied as normal conduction, and the inter-terminal voltage of the current-limiting element was confirmed to be no greater than 0.1 mV (p–p). This was followed by conduction of the current shown in FIG. 10 (64) simulating an abnormal current, for a case assuming an accident occurring with no current-limiting element. A current-limiting element was then inserted and the current-limiting property was tested with the same conduction. FIG. 10 shows the current (66) at each position and the time-related change of the applied magnetic field (66a).

After the current reached 900 A, 0.4 T was applied within 0.03 msec and the current-limiting operation began within 0.30 msec, while essential completion of the current-limiting operation within 1.8 msec was confirmed. Here, completion of the current-limiting operation means that the current increase had stopped and had begun to decrease.

As a comparative example, FIG. 10 shows the time-related change of the current and resistance (65) at each position in the same conduction experiment without application of a magnetic field. The voltage began to be generated in the current-limiting element upon conduction of 950 A, but because quenching is not propagated to the entire element, the resistance of the superconductor does not increase rapidly and therefore the current reaches a maximum of 1200 A, resulting in a low current-limiting effect.

These experiments demonstrated that application of a magnetic field to the current-limiting element achieves a rapid and considerable current-limiting effect.

Example 2

A single crystal superconductive bulk material with a diameter of 46 mm and a height of 15 mm having $Y_2BaCuO_5$ finely dispersed in $YBa_2Cu_3O_{7-x}$ was cut into a slice with a thickness of 1 mm as shown in FIG. 8A, and was subjected to notch working to fabricate a current-limiting element with a meander shape having an effective length of about 600 mm and a current path cross-sectional area of 1 mm², as shown in FIG. BB. Next, an Ag thin-film was vapor deposited over the entire surface of the current-limiting element to a thickness of about 1 micron and held for 10 minutes in an oxygen stream while first heating it to 900° C., after which it was cooled by lowering the temperature to 600° C. over 2 hours and then to room temperature over 20 hours. Insulating tape (Captone) with a thickness of about 20 μm was pasted onto one side of the superconductor and silver was vapor deposited thereon to 2 microns, to fabricate a meander-shaped heater. Copper lead wires were also connected to the electrodes at both ends with solder, and then cooled in liquid nitrogen.

A circuit was constructed whereby a 0.4 T magnetic field was applied to the current-limiting element and heating with an output of about 40 W could be accomplished by conduction to the heater, at the moment of 900 A conduction or when the current value changed at $2.0 \times 10^6$ A/sec or above.

First, an alternating current of 500 A (p–p) was applied as normal conduction, and the inter-terminal voltage of the current-limiting element was confirmed to be no greater than 0.1 mV (p–p). This was followed by conduction of a current simulating an abnormal current for a case assuming occurrence of an accident.

After the current reached 900 A, a 0.4 T magnetic field and a conduction current were applied within 0.03 msec and the current-limiting operation began within 0.25 msec, while essential completion of the current-limiting operation within 1.5 msec was confirmed, basically as shown in FIG. 10.

Example 3

The current-limiting element described in Example 1 was fabricated and cooled in liquid nitrogen for testing. A circuit was also constructed whereby a 0.4 T magnetic field was applied to the current-limiting element at the moment of 960 A conduction or when a voltage of 1 mV or greater was generated in the current-limiting element.

First, an alternating current of 500 A (p–p) was applied as normal conduction, and the inter-terminal voltage of the current-limiting element was confirmed to be no greater than 0.1 mV (p–p). This was followed by conduction of the current shown in FIG. 10, simulating an abnormal current for a case assuming occurrence of an accident.

After the current reached 950 A, 0.4 T was applied within 0.03 msec and the current-limiting operation began within 0.30 msec, while essential completion of the current-limiting operation within 1.8 msec was confirmed.

Example 4

A single crystal superconductive bulk material with a diameter of 75 mm and a height of 15 mm having $Y_2BaCuO_5$ finely dispersed in $YBa_2Cu_3O_{7-x}$ was cut into a slice with a thickness of 0.8 mm, and was subjected to notch working to fabricate a current-limiting element with a meander shape having an effective length of about 200 mm and a current path cross-sectional area of 1.6 mm$^2$. The meander-shaped current-limiting element is shown in FIG. 2. As FIG. 2 shows, the elemental lines 41 had a 2.0 mm width and the spacing of the wiring 41 was 1.5 mm, but the elemental lines 40 at both ends was 7.0 mm and the width at the elemental line turn sections was 5.0 mm. Next, an Ag thin-film was vapor deposited over the surface to a thickness of about 1 micron and held for 10 minutes in an oxygen stream while first heating it to 900° C., after which it was cooled by lowering the temperature to 600° C. over 2 hours and then to room temperature over 20 hours.

Copper lead wires were connected to the electrodes at both ends of the current-limiting element with solder. A similar meander-shaped NiCr bypass resistor with a thickness of 0.5 mm was fabricated, and as shown in FIG. 4, the elemental line turn sections of the current-limiting element 20 and the elemental line turn sections of the bypass resistor 21 were connected via copper lead wires 22 with a length of about 1 cm, to construct a bypass circuit. The magnetic field application circuit shown in FIG. 6A was then mounted thereon.

This magnetic field application circuit applies magnetic fields 34 in opposite directions alternately to pairs of elemental lines, as shown in FIG. 6A. A variable resistor (not shown) is also connected in series to the coil 33 wound on each opposing iron core 32, for a construction allowing adjustment of non-uniformity in the superconductive characteristics of each elemental lines. In other words, the applied magnetic field (magnetizing current) is adjusted downwards by the variable resistor for wires where a large flux flow resistance appears with a low conduction current.

The pulse magnetic field application power source used was a power source having a combination of a thyristor switch and an LC resonance circuit. The construction is such that the charge stored by the condenser is discharged by the thyristor switch, and after detection of abnormal current it conducts from half a wavelength to a few cycles at 50–400 Hz to cut off the thyristor switch. With this construction, a sufficient charge remains in the condenser after restoration, so that after restoration it can respond to further abnormal current generations occurring after a few milliseconds.

The meander-shaped current-limiting elements on which the bypass resistor and magnetic field application device are mounted are connected in a series of three, and cooled in liquid nitrogen. After cooling, the magnetic field intensity applied to each wiring path when an abnormality was detected was an average of 1.2 T (peak value) after adjustment of non-uniform superconductive characteristics.

Figure 11A:
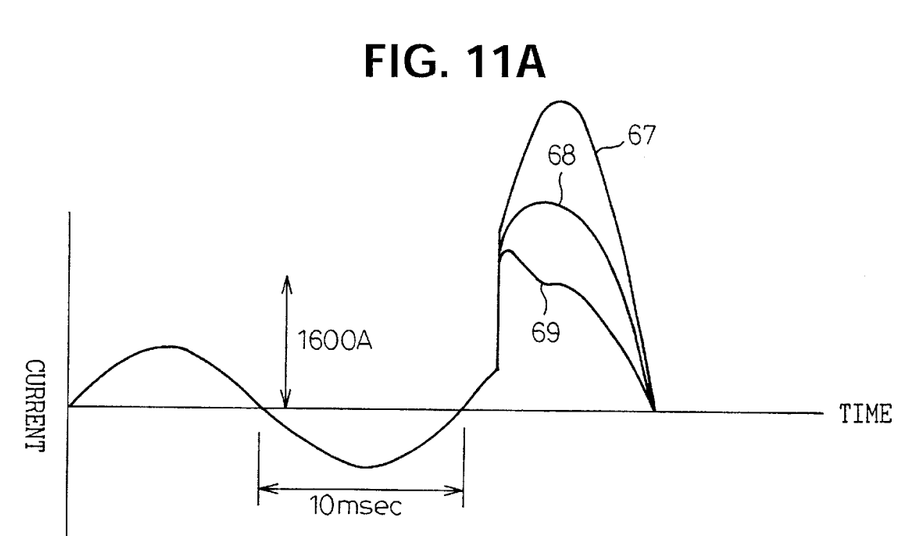
Figure 11B:
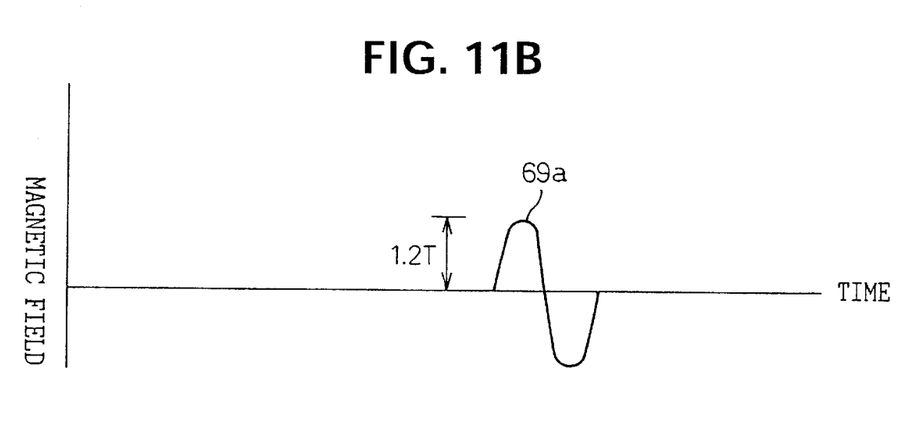

Next, an alternating current of 700 A (p–p: peak to peak) was applied as normal conduction, and the interterminal voltage of the current-limiting element was confirmed to be no greater than 0.1 mV (p–p). This was followed by conduction of the current shown in FIG. 11, simulating an abnormal current for a case assuming an accident occurring without a current-limiting element. The abnormal current (67) was set so as to stop the current at roughly half-cycle flow (at zero transmission). A current-limiting element was then inserted and the current-limiting property was tested with the same conduction. FIG. 11 shows the current (69) and the time-related change of the applied magnetic field (69a) at each position. After the current reached 1600 A, a 1.2 T magnetic field was applied in about 1.2 msec, and essential completion of the current-limiting operation in about 2.0 msec was confirmed.

As a comparative example, FIG. 11 shows the time-related change of the current and resistance (68) at each position in the same conduction experiment without application of a magnetic field. Since the resistance of the superconductor does not increase rapidly, the current reaches a maximum of about 2600 A, resulting in a low current-limiting effect.

These experiments demonstrated that application of a magnetic field to the current-limiting element achieves a rapid and considerable current-limiting effect.

Example 5

A meander-shaped current-limiting element was fabricated in the same manner as Example 4. This differed from Example 4, however, in that connection between the meander current-limiting element and the bypass resistor was accomplished by connecting the meander current-limiting element and bypass resistor via the gaps of the iron core, forming approximately 5 mm electrodes at the center of each elemental line of the current-limiting element and at the center of each elemental line of the bypass resistor.

The pulse magnetic field application power source used was a large-capacity power amplifier, instead of one having a combination of a thyristor switch and an LC resonance circuit. The construction using this power source was such that as to produce conduction 10 ms after detection of abnormal current.

An alternating current of 700 A (p–p: peak to peak) was applied as normal conduction, and the inter-terminal voltage of the current-limiting element was confirmed to be no greater than 0.1 mV (p–p). The abnormal current was set so to be zero after roughly one cycle flow (the moment of the second zero conduction). After inserting the current-limiting element, upon reaching a current of 1600 A a 0.8 T magnetic field was applied in about 0.2 msec, and essential completion of the current-limiting operation in about 2.5 msec was confirmed. There was no damage to the current-limiting element even with about one cycle flow of abnormal current.

As a comparative example, the same conduction experiment was carried out without application of a magnetic field. Application of a magnetic field resulted in a low current-limiting effect, which was roughly the same as the comparative example described in Example 4.

Example 6

The meander-shaped current-limiting element shown in FIG. 3, having a thickness of 1.0 mm, a current path cross-sectional area of 1.8 mm$^2$ and an effective length of about 200 mm was fabricated in the same manner as Example 4. The spacing between elemental lines was alternately 0.8 mm and 2.2 mm. The width of the elemental lines was 7.0 mm at both ends 43, 2.0 mm for the inner elemental line 44, and 4.0 mm for the elemental line turn sections 45. An Ag thin-film was vapor deposited only over the surface of the electrodes and the elemental line turn sections to a thickness of about 1 micron and annealed in an oxygen stream.

Next, copper lead wires were connected to the electrodes at both ends of the current-limiting element with solder. A similar meander-shaped NiCr bypass resistor with a thickness of 1.5 mm was fabricated, and the elemental line turn sections of the current-limiting element and the elemental line turn sections of the bypass resistor were connected via copper lead wires with a length of about 1 cm, to construct a bypass circuit (see FIG. 4). Quartz powder was mixed with a two-part curing resin [Stycast 2850GT+Catalyst 9 (Emerson & Cummings Co.)], and upon placing a 0.5 mm-thick FRP sheet on both sides of the meander-shaped material, the above-mentioned resin was used to reinforce the spaces between the elemental lines (see FIG. 5). The magnetic field application circuit shown in FIG. 6B was mounted on the current-limiting element fabricated in this manner.

With this magnetic field application circuit, elemental lines 31 has a magnetic field 34 applied in opposite directions for pairs of elemental lines, as shown in the drawing. A variable resistor (not shown) is also connected in series to the coil 33 wound on each opposing iron core 32, for a construction allowing adjustment of non-uniformity in the superconductive characteristics of each elemental line.

The pulse magnetic field application power source used was a power source having a combination of a thyristor switch and an LC resonance circuit. The construction is such that the charge stored by the condenser is discharged by the thyristor switch, and after detection of abnormal current it conducts from half a wavelength to a few cycles at 50–400 Hz to cut off the thyristor switch. With this construction, a sufficient charge remains in the condenser after restoration, so that after restoration it can respond to further abnormal current generations occurring after a few milliseconds.

The meander-shaped current-limiting elements on which the bypass resistor and magnetic field application device are mounted are connected in a series of three, and cooled in liquid nitrogen. After cooling, the magnetic field intensity applied to each elemental line when an abnormality was detected was an average of 1.2 T (peak value) after adjustment of non-uniform superconductive characteristics.

FIG. 1 is a conceptual view of an experimental conduction circuit. When an abnormal current is detected by the current monitor resistor 5, a current is supplied from the magnetic field application power source 1 to the magnetic field application coil 6. At that time, a magnetic field is applied to the current-limiting element 2, quenching is promoted and the current-limiting operation is rapidly carried out. FIG. 1 is a circuit diagram where this type of current-limiting device is connected to a power source 3.

Figure 12A:
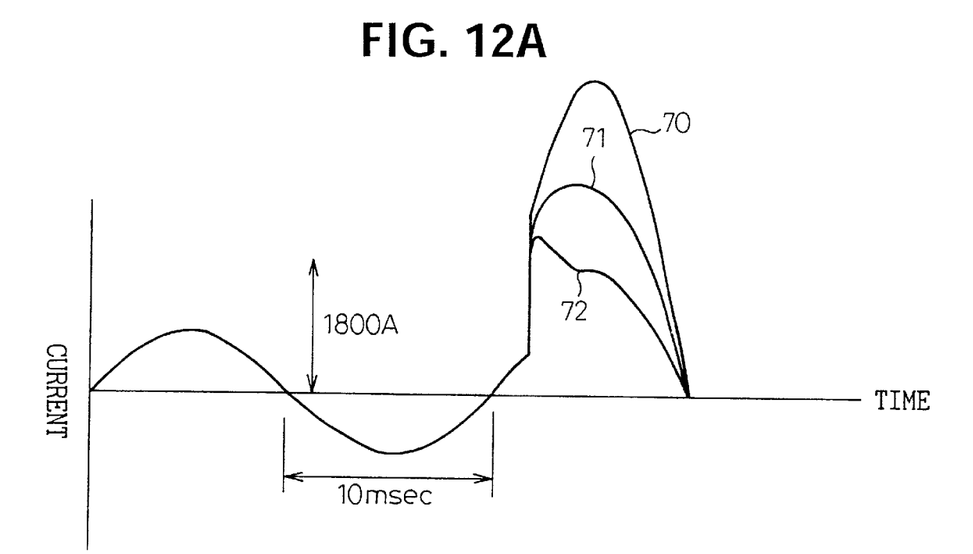
Figure 12B:
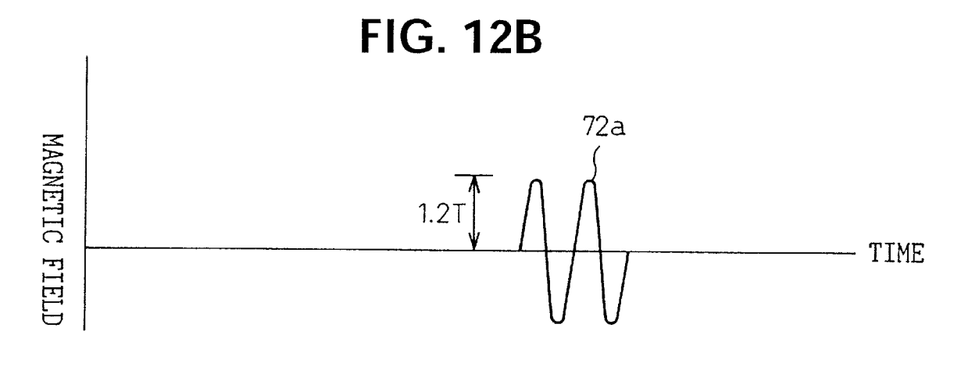

Next, an alternating current of 900 A (p–p: peak to peak) was applied as normal conduction, and the interterminal voltage of the current-limiting element was confirmed to be no greater than 0.1 mV (p–p). This was followed by conduction of the current shown in FIG. 12, simulating an abnormal current for a case assuming an accident occurring without a current-limiting element. The abnormal current was set so as to stop the current at roughly half-cycle flow (at zero transmission) (70). A current-limiting element was then inserted and the current-limiting property was tested with the same conduction. FIG. 12 shows the current (72) and the time-related change of the applied magnetic field (72a) at each position. After the current reached 1800 A, a 1.2 T magnetic field was applied in about 1.2 msec, and essential completion of the current-limiting operation in about 2.0 msec was confirmed.

As a comparative example, FIG. 11 shows the time-related change of the current and resistance (71) at each position in the same conduction experiment without application of a magnetic field. It is shown that since the resistance value does not increase rapidly, the current-limiting effect is low.

Example 7

A meander-shaped current-limiting element was fabricated in the same manner as Example 6. This differed from Example 6, however, in that connection between the meander current-limiting element and the bypass resistor was accomplished by connecting the meander current-limiting element and bypass resistor via through-holes formed in the iron core, forming approximately 5 mm electrodes at the center of each elemental line of the current-limiting element and at the center of each elemental line of the bypass resistor.

The pulse magnetic field application power source used was a large-capacity power amplifier, instead of one having a combination of a thyristor switch and an LC resonance circuit. The construction using this power source was such as to produce conduction 10 ms after detection of abnormal current.

An alternating current of b 900A (p–p: peak to peak) was applied as normal conduction, and the inter-terminal voltage of the current-limiting element was confirmed to be no greater than 0.1 mV (p–p). The abnormal current was set so that the current was terminated after roughly one cycle flow (the moment of the second zero conduction). After inserting the current-limiting element, once the current reached 1800 A, a 0.8 T magnetic field was applied in about 0.2 msec, and essential completion of the current-limiting operation in about 2.5 msec was confirmed. There was no damage to the current-limiting element even with about one cycle of flow of abnormal current.

As a comparative example, the same conduction experiment was carried out without application of a magnetic field. Application of a magnetic field resulted in a low current-limiting effect, which was roughly the same as the comparative example described in Example 6.

These experiments demonstrated that application of a magnetic field to the current-limiting element achieves a rapid and considerable current-limiting effect.

As explained above, the present invention provides a current-limiting device characterized by avoiding blowout of the current-limiting element, whereby setting can accomplish rapid current-limiting operation, and its industrial effect is therefore immense.

What is claimed is:

1. A current-limiting element characterized by having a substantially meander-shaped sheet of a superconductive/normal conductive transition-type current-limiting element employing an oxide superconductor wherein $RE_2BaCuO_5$ (where RE is at least one element selected from among Y, Pr, Nd, Sm, Eu, Gd, Dy, Ho, Er, Tm, Yb and Lu) is finely dispersed in an $REBa_2Cu_3O_{7-x}$ phase, wherein the normal to the sheet surface is the c-axis direction of the $REBa_2Cu_3O_{7-x}$, and the width of the elemental line of the meander-shape at both ends thereof is larger than the width of the elemental line of the other sections.

2. A current-limiting element characterized by having a substantially meander-shaped sheet of a superconductive/normal conductive transition-type current-limiting element employing an oxide superconductor wherein $RE_2BaCuO_5$ (where RE is at least one element selected from among Y, Pr, Nd, Sm, Eu, Gd, Dy, Ho, Er, Tm, Yb and Lu) is finely dispersed in an $REBa_2Cu_3O_{7-x}$ phase, wherein the normal to the sheet surface is the c-axis direction of the $REBa_2Cu_3O_{7-x}$, and the cross-sectional area of the turn sections connecting the meander-shaped lines is larger than the cross-sectional area of the main body of the elemental lines.

3. A current-limiting element characterized by having a substantially meander-shaped sheet of a superconductive/normal conductive transition-type current-limiting element employing an oxide superconductor wherein $RE_2BaCuO_5$ (where RE is at least one element selected from among Y, Pr, Nd, Sm, Eu, Gd, Dy, Ho, Er, Tm, Yb and Lu) is finely dispersed in an $REBa_2Cu_3O_{7-x}$. phase, wherein the normal to the sheet surface is the c-axis direction of the $REBa_2Cu_3O_{7-x}$, and the aspect ratio of the cross-section of the elemental lines of the meander-shape (thickness in the c-axis direction/width in the a- or b-axis direction) is 0.6-0.2.

4. A current-limiting element characterized by having a substantially meander-shaped sheet of a superconductive/normal conductive transition-type current-limiting element employing an oxide superconductor wherein $RE_2BaCuO_5$ (where RE is at least one element selected from among Y, Pr, Nd, Sm, Eu, Gd, Dy, Ho, Er, Tm, Yb and Lu) is finely dispersed in an $REBa_2Cu_3O_{7-x}$ phase, wherein the normal to the sheet surface is the c-axis direction of the $REBa_2Cu_3O_{7-x}$, and the spacings between the elemental lines of the meander-shape are not consistent.

5. A current-limiting element characterized by having a substantially meander-shaped sheet of a superconductive/normal conductive transition-type current-limiting element employing an oxide superconductor wherein $RE_2BaCuO_5$ (where RE is at least one element selected from among Y, Pr, Nd, Sm, Eu, Gd, Dy, Ho, Er, Tm, Yb and Lu) is finely dispersed in an $REBa_2Cu_3O_{7-x}$. phase, wherein the normal to the sheet surface is the c-axis direction of the $REBa_2Cu_3O_{7-x}$, and the spacings between the elemental lines of the meander-shape alternately change.

6. A current-limiting element characterized by having a substantially meander-shaped sheet of a superconductive/normal conductive transition-type current-limiting element employing an oxide superconductor wherein $RE_2BaCuO_5$ (where RE is at least one element selected from among Y, Pr, Nd, Sm, Eu, Gd, Dy, Ho, Er, Tm, Yb and LU) is finely dispersed in an $REBa_2Cu_3O_{7-x}$ phase, wherein the normal to the sheet surface is the c-axis direction of the $REBa_2Cu_3O_{7-x}$, and a conduction current bypass circuit which is not electrically connected with the elemental lines is provided between both ends of the meander shape and/or between the turn sections of the elemental lines.

7. A current-limiting element characterized by having a substantially meander-shaped sheet of a superconductive/normal conductive transition-type current-limiting element employing an oxide superconductor wherein $RE_2BaCuO_5$ (where RE is at least one element selected from among Y, Pr, Nd, Sm, Eu, Gd, Dy, Ho, Er, Tm, Yb and Lu) is finely dispersed in an $REBa_2Cu_3O_{7-x}$ phase, wherein the normal to the sheet surface is the c-axis direction of the $REBa_2Cu_3O_{7-x}$, a bypass circuit is provided within an elemental line of the meander-shape, and the bypass current flows between the iron cores of or through through-holes in a magnetic field application coil.

8. A current-limiting element characterized by having a substantially meander-shaped sheet of a superconductive/normal conductive transition-type current-limiting element employing an oxide superconductor wherein $RE_2BaCuO_5$ (where RE is at least one element selected from among Y, Pr, Nd, Sm, Eu, Gd, Dy, Ho, Er, Tm, Yb and Lu) is finely dispersed in an $REBa_2Cu_3O_{7-x}$ phase, wherein the normal to the sheet surface is the c-axis direction of the $REBa_2Cu_3O_{7-x}$, and a resin is present at least between the elemental lines of meander-shape.

9. A current-limiting device characterized by including a superconductive/normal conductive transition-type current-limiting element employing an oxide superconductor wherein $RE_2BaCuO_5$ (where RE is at least one element selected from among Y, Pr, Nd, Sm, Eu, Gd, Dy, Ho, Er, Tm, Yb and Lu) is finely dispersed in an $REBa_2Cu_3O_{7-x}$ phase, the superconductor of said superconductive/normal conductive transition-type current-limiting element usually carrying a load current lower than a critical current but a current flowing through the superconductor exceeding the critical current in the event of an accidental short-circuit causing transition of the superconductor from a superconductive state to a normal conductive state, thus generating electrical resistance, and by having a mechanism that promotes or generates quenching in addition to the conduction current, said quenching being rapid transition of the superconductor from the superconductive state to the normal conductive state.

10. A current-limiting device according to claim 9, characterized by having a mechanism that detects abnormal current and applies a magnetic field.

11. A current-limiting device according to claim 10, characterized in that the magnetic field is applied parallel to the c-axis of the oxide superconductive material.

12. A current-limiting device according to claim 9, characterized in that at least a plurality of polar magnetic fields are simultaneously applied to a single meander-shaped superconductive/normal conductive transition-type current-limiting element.

13. A current-limiting device according to claim 9, characterized in that magnetic fields of different polarity are alternately applied to every two elemental lines of the meander-shaped superconductive/normal conductive transition-type current-limiting element.

14. A current-limiting device according to claim 9 which has a mechanism that adjusts the applied magnetic field distribution in response to non-uniformity of the superconductive characteristics of the superconductive/normal conductive transition-type current-limiting element.

15. A current-limiting device according to claim 10, characterized in that the current power source to the magnetic field application coil substantially consists of an LC resonance circuit including a condenser and a thyristor switch.

16. A current-limiting device according to claim 9, characterized by having a mechanism that detects abnormal current and heats the current-limiting element.

17. A current-limiting device according to claim 16, characterized in that a current is allowed to flow to a heating conduction current mounted parallel to the current-limiting element.

18. A current-limiting device according to claim 16, characterized in that the surface of the current-limiting element has a conductive layer via an insulating layer.

19. A current-limiting device according to claim 9, characterized by being provided with a magnetic field application mechanism which is activated when current flowing through the current-limiting element exceeds a given current value.

20. A current-limiting device according to claim 9, characterized by being provided with a current-limiting element-heating mechanism which is activated when current flowing through the current-limiting element exceeds a given current value.

21. A current-limiting device according to claim 9, characterized by being provided with a magnetic field application mechanism which is activated when the size of the time-related change of the current value flowing through the current-limiting element exceeds a given value.

22. A current-limiting device according to claim 9, characterized by being provided with a current-limiting element-heating mechanism which is activated when the size of the time-related change of the current value flowing through the current-limiting element exceeds a given value.

23. A current-limiting device according to claim 9, characterized by being provided with a magnetic field application mechanism which is activated when a given voltage value is generated in the current-limiting element.

24. A current-limiting device according to claim 9, characterized by being provided with a current-limiting element-heating mechanism which is activated when a given voltage value is generated in the current-limiting element.

* * * * *

UNITED STATES PATENT AND TRADEMARK OFFICE
CERTIFICATE OF CORRECTION

PATENT NO.    : 6,344,956 B1
DATED         : February 5, 2002
INVENTOR(S)   : Mitsuru Morita It is certified that error appears in the above-identified patent and that said Letters Patent is hereby corrected as shown below:

<u>Title page,</u>
Item [54], change "OXIDE BULK SUPERCONDUCTING CURRENT LIMITING ELEMENT CURRENT" to -- OXIDE BULK SUPERCONDUCTING ELECTRIC LIMITING ELEMENT AND ELECTRIC LIMITING DEVICE --;
After Item [30], Foreign Application Priority Data, delete
"May 8, 1998 (JP) ………………….10-140435".

Signed and Sealed this

Seventh Day of October, 2003

JAMES E. ROGAN
*Director of the United States Patent and Trademark Office*